United States Patent
Andreev et al.

(10) Patent No.: US 7,111,264 B2
(45) Date of Patent: Sep. 19, 2006

(54) PROCESS AND APPARATUS FOR FAST ASSIGNMENT OF OBJECTS TO A RECTANGLE

(75) Inventors: Alexander E. Andreev, San Jose, CA (US); Andrey A. Nikitin, Moscow (RU); Ranko Scepanovic, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 159 days.

(21) Appl. No.: 10/688,460

(22) Filed: Oct. 17, 2003

(65) Prior Publication Data

US 2005/0086624 A1    Apr. 21, 2005

(51) Int. Cl.
*G06F 17/50* (2006.01)

(52) U.S. Cl. .................. 716/9; 716/7; 716/8; 716/10

(58) Field of Classification Search ............. 716/7–14, 716/18
See application file for complete search history.

(56) References Cited

U.S. PATENT DOCUMENTS

| | | | |
|---|---|---|---|
| 5,535,134 A | 7/1996 | Cohn et al. | |
| 5,818,729 A * | 10/1998 | Wang et al. ................... 716/9 |
| 6,014,506 A | 1/2000 | Hossain et al. | |
| 6,134,702 A * | 10/2000 | Scepanovic et al. .......... 716/10 |
| 6,189,132 B1 | 2/2001 | Heng et al. | |
| 6,292,929 B1 * | 9/2001 | Scepanovic et al. .......... 716/14 |
| 6,415,425 B1 | 7/2002 | Chaudhary et al. | |
| 6,637,016 B1 | 10/2003 | Gasanov et al. | |
| 6,650,046 B1 | 11/2003 | Shirakawa et al. | |
| 6,725,432 B1 | 4/2004 | Chang et al. | |
| 6,748,574 B1 * | 6/2004 | Sasagawa et al. ............. 716/9 |
| 2003/0163795 A1 | 8/2003 | Morgan et al. | |
| 2003/0188274 A1 | 10/2003 | Gasanov et al. | |
| 2004/0166864 A1 * | 8/2004 | Hill et al. ................... 455/450 |
| 2005/0038728 A1 * | 2/2005 | La Mura ..................... 705/37 |
| 2005/0091625 A1 | 4/2005 | Andreev et al. | |

* cited by examiner

*Primary Examiner*—Paul Dinh

(57) ABSTRACT

Objects are assigned to points in a rectangle by dividing the rectangle is divided into a plurality of smaller rectangles and applying an object assignment procedure, such as Kuhn's algorithm, to initially assigned objects in each second rectangle. The initial assignment is performed by calculating a maximal cost of assignment of objects to points, and selecting an assignment of objects having a minimum value of maximal cost, identified by iteratively recalculating the maximal matching assignment based on a midpoint of between the minimum and maximum costs.

20 Claims, 4 Drawing Sheets

PROCESS AND APPARATUS FOR FAST ASSIGNMENT OF OBJECTS TO A RECTANGLE

FIELD OF THE INVENTION

This invention concerns placement of objects in a rectangle, and particularly to placement of cells in integrated circuit designs during creation of a floorplan.

BACKGROUND OF THE INVENTION

The present invention is directed to a process and apparatus for assigning N objects to M points of a rectangle, where $M \geq N$. The invention is particularly useful in placement of cells in an integrated circuit (IC) chip, although it is also useful in other environments where a large number of object must be placed in a space.

Consider a rectangle having left and right edges a and b, where $a<b$, and bottom and top edges c and d, where $c<d$. The rectangle containing a point having coordinates (x,y) can be defined as $R=\{(x,y)|a \leq x \leq b, c \leq y \leq d\}$.

Points $P_1(x_1,y_1), P_2(x_2,y_2), \ldots, P_M(x_M,y_M)$, are the points of rectangle R. Objects $Q_1(x'_1,y'_1), Q_2(x'_2,y'_2), \ldots, Q_N(x'_N, y'_N)$ are the objects to be placed in rectangle R. T is a set of types of points and objects. $t_i$ is a type of a point $P_i$, where i is each member of the sequence of 1 to M ($i=\overline{1,M}$). Thus, $t_i \epsilon T$. $t'_i$ is a type of an object $Q_i$, $i=\overline{1,N}$, thus $t'_i \epsilon T$. For any pair of types, $u \epsilon T$ and $v \epsilon T$, the relation of these types TR(u,v) is such that if the object having a type v is allowed to be assigned to a point of type u, TR(u,v)=1. Otherwise, TR(u,v)=0. TR(u,u)=1 for each type $u \epsilon T$.

The goal of objects assignment is to assign all objects $Q_i$, $i=\overline{1,N}$ to points $P_{s(i)}$ (or to find the assignment s(i) for each $i=\overline{1,N}$), so that:

a) $s(i_1) \neq s(i_2)$ for any $1 \leq i_1 < i_2 \leq N$,
b) $TR(t_{s(i)},t'_i)=1$ for any $i=\overline{1,N}$, and
c) distances between objects $Q_i$ and points $P_{s(i)}$ is as small as possible.

The cost C(i,j) of assignment of an object $Q_i$ to a point $P_j$ is denoted as follows:

$$C(i,j) = \begin{cases} (x_j - x'_i)^2 + (y_j - y'_i)^2 & \text{if } TR(t_j, t'_i) = 1 \\ \infty & \text{if } TR(t_j, t'_i) = 0. \end{cases}$$

One well-known technique of assigning objects is Kuhn's algorithm, which finds the optimal solution s(i) such that the sum $$\sum_{i=1}^{N} C(i, s(i))$$

is the smallest possible value. However, Kuhn's algorithm requires a considerable amount of time to execute. More particularly, execution of Kuhn's algorithm requires time defined as $O(N^2M^2)$. In practice, cell placement might require processing cell assignments for large values of parameters N and M (N,M>1000), and might be repeated many times during the design process. Consequently, execution of Kuhn's algorithm requires an unacceptable amount of time. Therefore, a need exists for a technique to quickly estimate objects assignment.

SUMMARY OF THE INVENTION

In a first embodiment, a process assigns objects to points of a first rectangle. An initial assignment of the objects to points of the first rectangle is created. The first rectangle is divided into a plurality of second, smaller rectangles. An object assignment procedure is applied to the initially assigned objects in each second rectangle. Preferably, each point in the first rectangle is in at least two second rectangles.

In some embodiments, the initial assignment of objects is performed by calculating a maximal cost of assignment of object to points, and selecting an assignment of objects having a minimum value of maximal cost. More particularly, a maximal matching assignment is calculated by iteratively recalculating the maximal matching assignment based on a midpoint of between the minimum and maximum costs of the assignment calculated during the prior iteration, and then recalculating the minimum and maximum costs of the recalculated assignment, iterating until the minimum cost is not smaller than the maximum cost.

In other embodiments, the object assignment procedure comprises finding objects assigned to points of each second rectangle, applying Kuhn's algorithm of object assignment to the second rectangle, and correcting the assignment. This procedure is iteratively repeated until the assignment does not change.

In accordance with another embodiment of the present invention, the process is carried out in a computer under the control of a computer readable program having computer readable code that causes the computer to carry out the process.

DETAILED DESCRIPTION OF THE PREFERRED EMBODIMENTS

Figure 1:
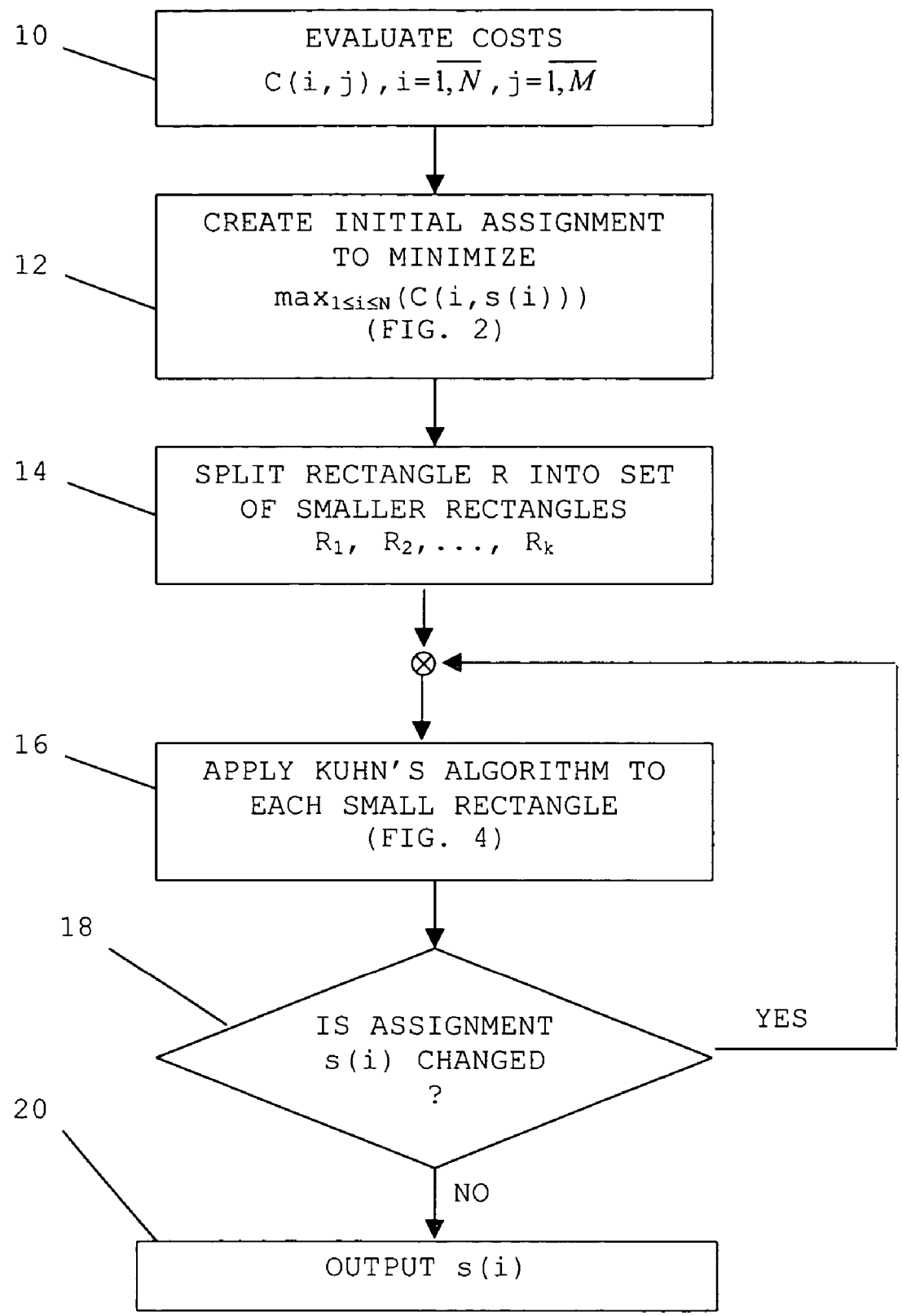
FIG. 1 is a flowchart of a process of assigning objects in accordance with an embodiment of the present invention.

FIG. 1 is a flowchart of a process of object assignment in accordance with a presently preferred embodiment of the present invention. The process is preferably carried out by a computer performing the process under control of a computer readable program code. The process commences at step 10 by evaluating the costs C(i,j) of assignment of objects $Q_i$ to points $P_j$, where $i=\overline{1,N}$ and $j=\overline{1,M}$. The costs are evaluated in accordance with the definition of costs assigned by the designer. At step 12, an initial assignment s(i) of objects $Q_i$ to points $P_j$ is created to achieve a minimization of the maximal cost. The process of initial assignment is more fully described in connection with FIG. 2.

Figure 2:
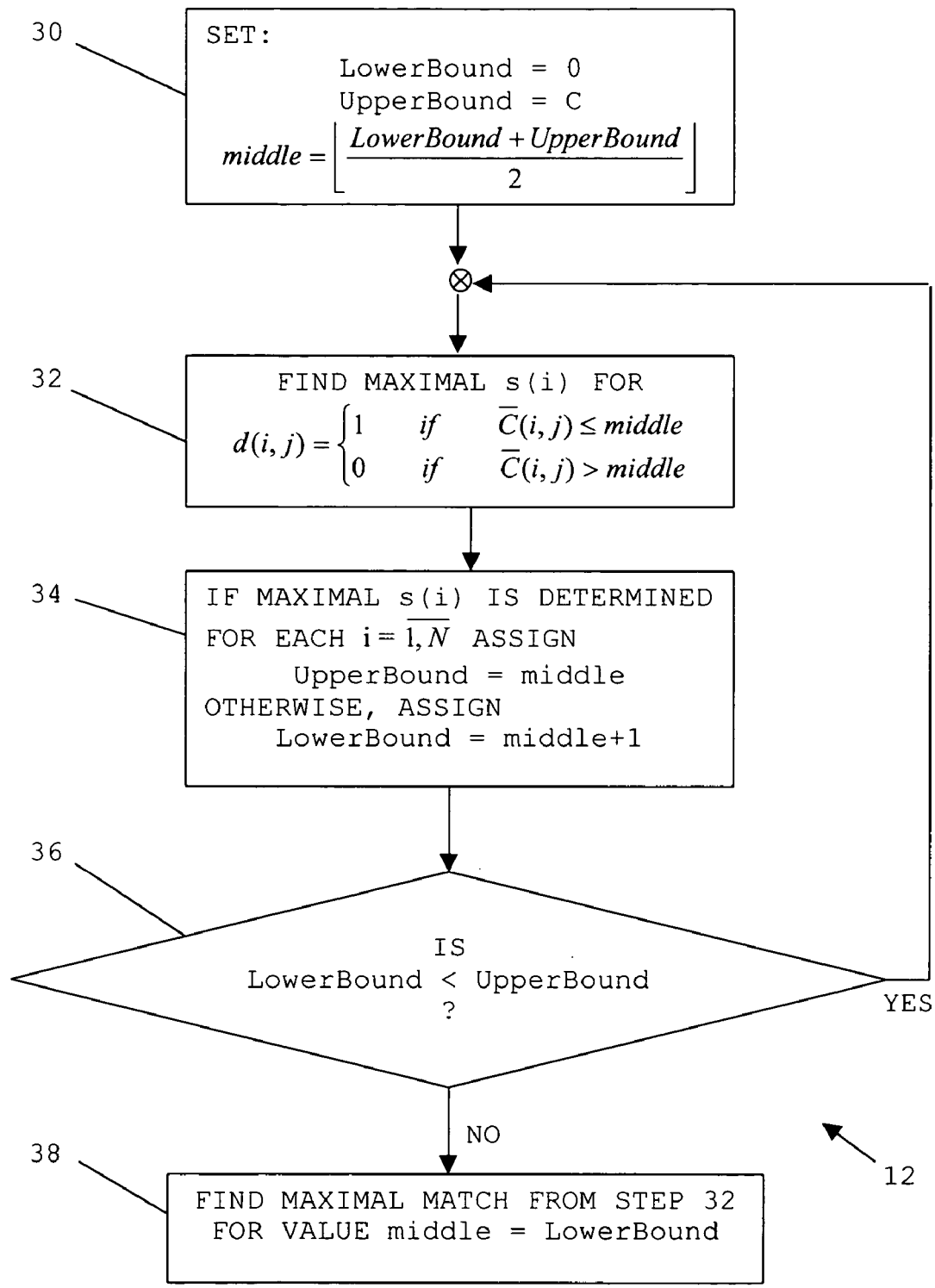
FIG. 2 is a flowchart of initial object assignment used in the process of FIG. 1.

Step 12, shown in detail in FIG. 2, obtains an initial assignment s(i) that results from the minimization of the maximal value of the cost: $\max_{1 \leq i \leq N}(C(i,s(i)))$. In order to simplify this step the process employs rounded costs $\overline{C}(i,j)$ instead of the original costs $C(i,j)$, where $$\overline{C}(i,j) = \begin{cases} \lfloor C(i,j) \rfloor & \text{if } C(i,j) \neq \infty \\ \infty & \text{if } C(i,j) = \infty, \end{cases}$$

and where $\lfloor C(i,j) \rfloor$ is the maximal integer not greater than $C(i,j)$. For purposes of explanation, the maximal cost is designated C, $C = \max_{\overline{C}(i,j) \neq \infty} (\overline{C}(i,j))$.

At step 30, the terms LowerBound is set to 0, UpperBound is set to the maximal cost integer (C), and middle is set to the midvalue between LowerBound and UpperBound:

LowerBound=0
UpperBound=C $$\text{middle} = \left\lfloor \frac{\text{LowerBound} + \text{UpperBound}}{2} \right\rfloor.$$

At step 32, the maximal matching assignment s(i) is found for matching matrix $$d(i,j) = \begin{cases} 1 & \text{if } \overline{C}(i,j) \leq \text{middle} \\ 0 & \text{if } \overline{C}(i,j) > \text{middle}. \end{cases}$$

At step 34, if the maximal matching s(i) obtained at step 32 is determined for each $i=\overline{1,N}$, such that the maximal cost is not greater than the middle (maximal cost≦middle), UpperBound is assigned to the value of middle, UpperBound=middle. Otherwise, LowerBound is assigned to the value of middle plus 1, LowerBound=middle+1.

If, at step 36, LowerBound<UpperBound, the process returns to step 32. Otherwise at step 38, the initial assignment is the maximal matching s(i) found at step 32 for the value middle=LowerBound. The assignment thus obtained is output to step 14 (FIG. 1).

The process of step 12 calculates a maximal matching assignment by iteratively recalculating the maximal matching assignment based on a midpoint of between the minimum and maximum costs of the assignment calculated during the prior iteration, and then recalculating the minimum and maximum costs of the recalculated assignment. The process continues to iterate until the minimum cost is not smaller than the maximum cost (i.e., LowerBound≧UpperBound).

The technique of finding the maximal matching s(i) in the bipartional graph determined by the matrix d(i,j) is well-known. It is also well known that the time required for the solution of this problem is O(MN). The process of FIG. 2 is a binary-searching algorithm for finding the value $\max_{1 \leq i \leq N}(\overline{C}(i,s(i)))$. The LowerBound and UpperBound used in the algorithm are the lower and upper bounds of the value $\max_{1 \leq i \leq N}(\overline{C}(i,s(i)))$. The number of repetitions of the steps 32–36 is $\lceil \log_2 C \rceil$, where $\lceil \log_2 C \rceil$ is the minimal integer number that is not less than $\log_2 C$. Consequently, time required to obtain the initial assignment s(i) is $O(\log_2 C \cdot MN)$.

Figure 3:
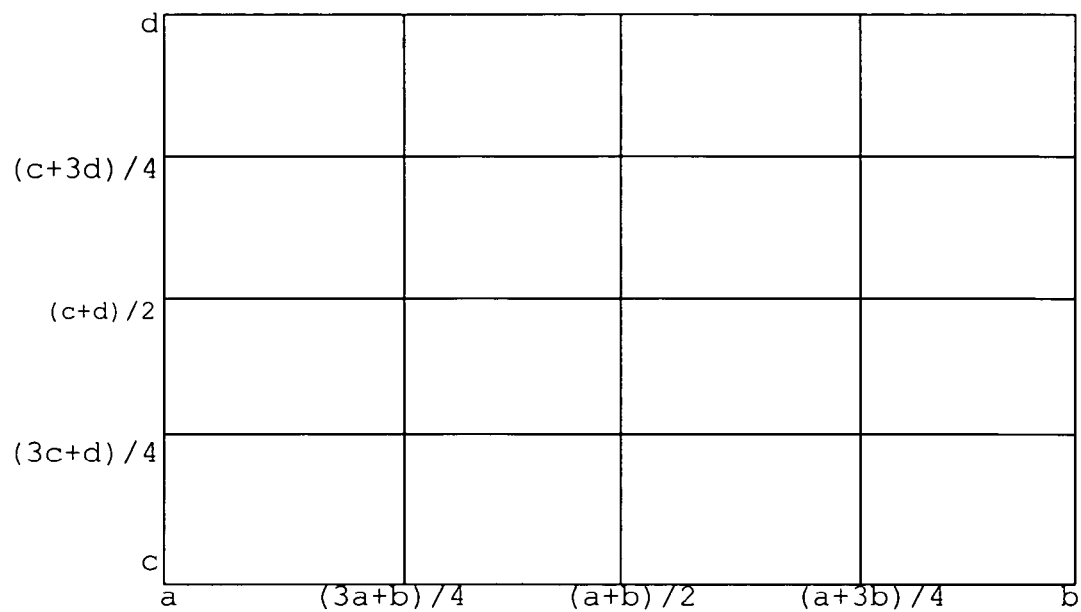
FIG. 3 is a diagram useful in explaining the process of FIG. 1.
Figure 3:
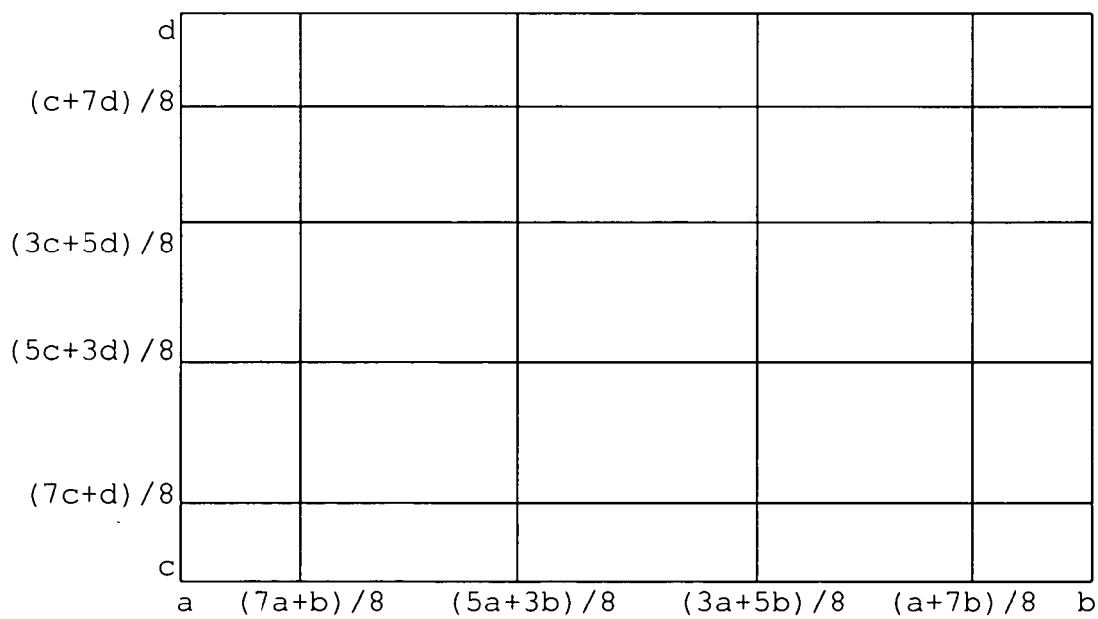

As shown in FIG. 1, at step 14 a rectangle R is split into a set of small rectangles $R_1, R_2, \ldots, R_k$. The splitting of rectangle R can be made by any of several techniques. The small rectangles $R_1, R_2, \ldots, R_k$ has intersections such that every point of the rectangle R belongs to at least 2 small rectangles. FIG. 3 illustrates splitting a rectangle R into k=41 small rectangles, shown as 16 equal small rectangles in the upper portion of FIG. 3 and 25 more small portions in the lower portion of the figure. Note that the small rectangles may have different sizes.

If $M_q$ is the number of points, $P_j$, $j=\overline{1,M}$, that belong to a small rectangle $R_q$, it is evident that more powerful splitting is obtained as the number of points of rectangle $R_q$ becomes smaller (value of $\max_{1 \leq q \leq k} (M_q)$ becomes smaller). If rectangle R is uniformly split, then $$M_q = O\left(\frac{M}{k}\right).$$

Figure 4:
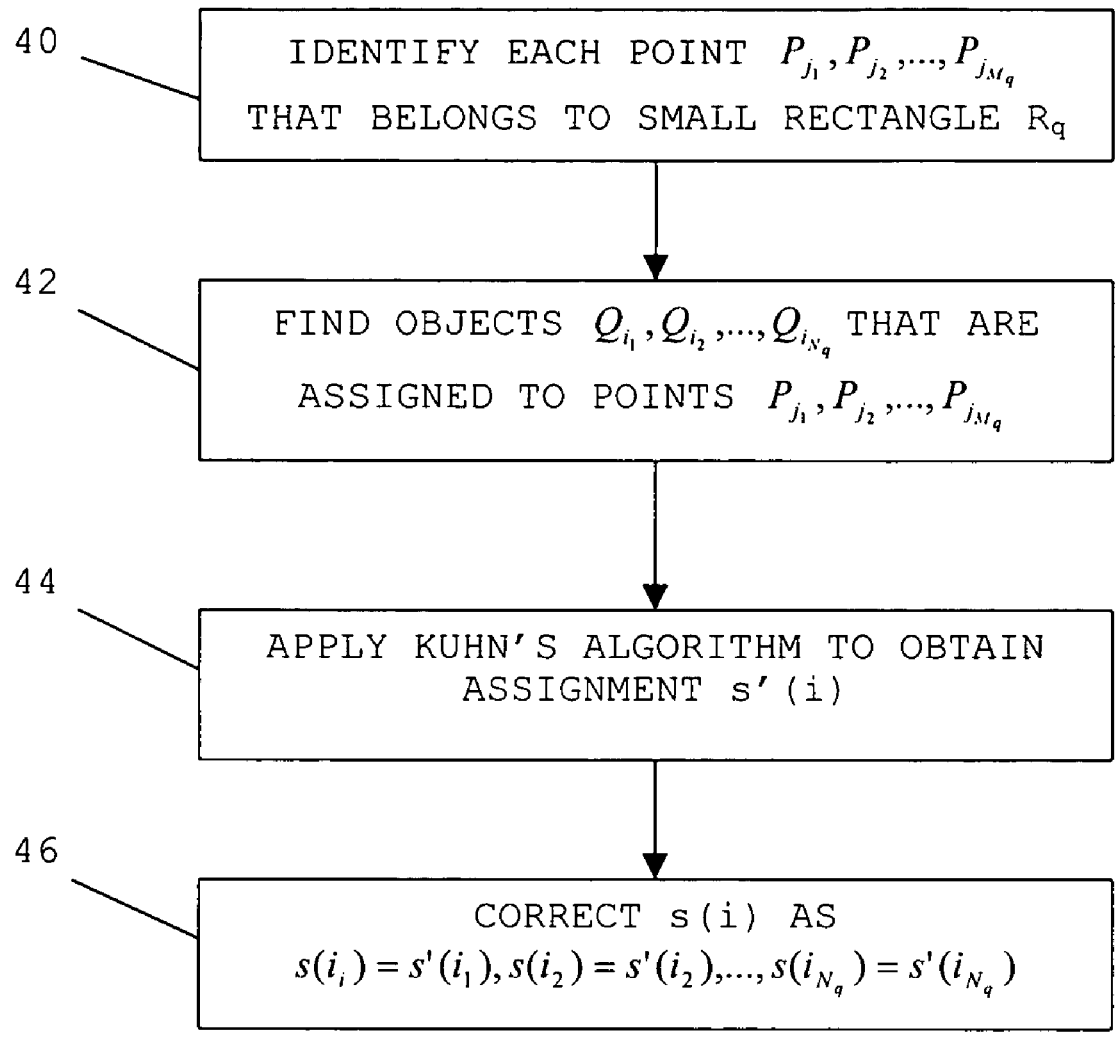
FIG. 4 is a flowchart of application of Kuhn's algorithm used in the process of FIG. 1.

At step 16, each small rectangle $R_1, R_2, \ldots, R_k$, is examined using Kuhn's algorithm of assignment to correct the assignment s(i). The procedure of step 16 is more fully described in connection with FIG. 4. For each small rectangle $R_q$ at step 40, all points $$P_{j_1}, P_{j_2}, \ldots, P_{j_{M_q}}$$

that belong to the small rectangle $R_q$ are considered. At step 42, all objects $$Q_{i_1}, Q_{i_2}, \ldots, Q_{i_{N_q}}$$

that are assigned to points $$P_{j_1}, P_{j_2}, \ldots, P_{j_{M_q}}$$

are located. Objects $$Q_{i_1}, Q_{i_2}, \ldots, Q_{i_{N_q}}$$

are those objects $Q_i$ for which $s(i) \in \{j_1, j_2, \ldots, j_{M_q}\}$. At step 44, Kuhn's algorithm of object assignment is applied to place objects $$Q_{i_1}, Q_{i_2}, \ldots, Q_{i_{N_q}}$$

at points $$P_{j_1}, P_{j_2}, \ldots, P_{j_{M_q}}$$

and obtain an assignment s'(i). At step 46, the assignment achieved at step 12 (FIG. 12) is corrected as $$s(i_1)=s'(i_1), s(i_2)=s'(i_2), \ldots, s(i_{N_q})=s'(i_{N_q}).$$

The time required to perform Kuhn's algorithm to each small rectangle $R_1, R_2, \ldots, R_k$ at step 44 is $$O(N_q^2 \cdot M_q^2) = O\left(\frac{M^4}{k^4}\right),$$

so the time required to perform Kuhn's algorithm to all k small rectangles is $$O\left(\frac{M^4}{k^3}\right),$$

which is significantly shorter than the time required to apply Kuhn's algorithm of assignment to the entire rectangle R.

The process of FIG. 1 then continues to step 18 to determine whether the assignment s(i) was changed at step 16. If assignment s(i) did not change at step 16, the process continues to step 20 where the final assignment s(i) is output. If s(i) changed, the process returns to step 16 to re-define small rectangles and re-calculate Kuhn's algorithm. Each iteration uses the assignment calculated in the prior iteration, with the iterations continuing until s(i) does not change at step 18. Hence, each iteration produces a more accurate object assignment than the prior iteration. As an alternative to detecting an unchanging assignment at step 18, the process could continue to step 20 upon some other convenient event, such as execution of a predetermined number of iterations of the loop including step 16, or if the assignment change by the latest iteration of step 16 is less than some predetermined amount.

The present invention thus provides a good estimate of the placement of objects in a rectangle, such as cells in the floorplan of an integrated circuit, in a shorter period of time than required by the Kuhn's algorithm. More particularly the time of performing the process of the present invention in a computer is the sum of the initial assignment (step 12) and the final assignment (step 16) and is $$O(MN \cdot \log_2 C) + O\left(\frac{M^4}{k^3}\right).$$

Although the present invention has been described with reference to preferred embodiments, workers skilled in the art will recognize that changes may be made in form and detail without departing from the spirit and scope of the invention.

What is claimed is:

1. A process of assigning objects to points of a first rectangle comprising steps of:
    a) creating an initial object assignment to points of the first rectangle with an initial assignment procedure, comprising:
        a1) calculating a maximal cost of assignment of objects to points of the first rectangle, and
        a2) selecting an assignment of objects having a minimum value of the maximal cost;
    b) dividing the first rectangle into a plurality of second rectangles; and
    c) applying an object assignment procedure, which is different than the initial object assignment procedure, to the initially assigned objects in each second rectangle.

2. The process of claim 1, wherein step a2) comprises: calculating an initial assignment based on a relationship of cost values at each point of the first rectangle to a midvalue of the maximal cost.

3. The process of claim 2, wherein step a2) further comprises:
    recalculating minimal and maximal costs based on the calculated initial assignment, and
    recalculating the initial assignment based on a midvalue between the recalculated minimal and maximal costs.

4. The process of claim 3, wherein step a2) further comprises:
    iteratively repeating recalculation of minimal and maximal costs and the initial assignment until the minimal cost is not smaller than the maximal cost.

5. The process of claim 1, wherein step a2) comprises:
    calculating a minimum cost, maximum cost and a middle cost based on a midvalue between the minimum and maximum costs,
    calculating maximal assignment for a matching matrix $$d(i, j) = \begin{cases} 1 & \text{if } \overline{C}(i, j) \leq \text{middle cost} \\ 0 & \text{if } \overline{C}(i, j) > \text{middle cost,} \end{cases}$$

where $\overline{C}(i,j)$ is a rounded cost value for each for assignment of i objects to j points,
    if a maximal assignment is found having a cost no greater than the middle cost, reset the maximum cost equal to the middle cost, otherwise reset the lower cost to greater than the middle cost,
    repeat finding maximal assignment and re-setting of minimum and maximum costs until the minimum cost $\geq$ the maximum cost.

6. The process of claim 1, wherein the dividing of the first rectangle is performed so that each point in the first rectangle is in at least two second rectangles.

7. The process of claim 1, wherein the object assignment procedure is application of Kuhn's algorithm.

8. The process of claim 1, wherein step c) comprises, for each second rectangle:
    c1) finding objects assigned to points of the second rectangle, and
    c2) adjusting the initial assignment of objects in the second rectangle using Kuhn's algorithm of object assignment.

9. The process of claim 8, further comprising:
    iteratively repeating step c) until occurrence of a predetermined event.

10. The process of claim 1, further comprising:
    iteratively repeating step c) until occurrence of a predetermined event.

11. A computer useable medium having a computer readable program embodied therein for assigning objects to points of a first rectangle, the computer readable program comprising:
    first computer readable program code for causing the computer to calculate a maximal cost of assignment of objects to points to the first rectangle and create an initial object assignment to points of the first rectangle, which has a minimum value of the maximal cost;

second computer readable program code for causing the computer to divide the first rectangle into a plurality of second rectangles; and third computer readable program code for causing the computer to create an object assignment of the initially assigned objects in each second rectangle to points in the second rectangle, using an object assignment algorithm that is different than that used to create the initial object assignment.

12. The computer useable medium of claim 11, wherein the first computer readable program code comprises:

computer readable program code for causing the computer to calculate an initial assignment for a matching matrix that is based on a relationship of cost values at each point of the first rectangle to a midvalue of the maximal cost.

13. The computer useable medium of claim 12, wherein the first computer readable program code further comprises:

computer readable program code for causing the computer to recalculate minimal and maximal costs based on the calculated initial assignment, and computer readable program code for causing the computer to recalculate the initial assignment based on a midvalue between the recalculated minimal and maximal costs.

14. The computer useable medium of claim 13, wherein the first computer readable program code further comprises:

computer readable program code for causing the computer to iteratively repeat recalculation of minimal and maximal costs and the initial assignment until the minimal cost is not smaller than the maximal cost.

15. The computer useable medium of claim 11, wherein the first computer readable program code comprises:

computer readable program code for causing the computer to calculate a minimum cost, a maximum cost and a middle cost based on a midvalue between the minimum and maximum costs, computer readable program code for causing the computer to calculate a maximal assignment for a matching matrix $$d(i, j) = \begin{cases} 1 & \text{if } \overline{C}(i, j) \leq \text{middle cost} \\ 0 & \text{if } \overline{C}(i, j) > \text{middle cost,} \end{cases}$$

where $\overline{C}(i,j)$ is a rounded cost value for each for the assignment of i objects to j points, computer readable program code for causing the computer to reset the maximum cost equal to the middle cost if the maximal assignment has a cost not greater than the middle cost, and to reset the minimum cost to an amount greater than the middle cost if the maximal assignment has a cost greater than the minimum cost, and computer readable program code for causing the computer to iteratively repeat calculating the maximal assignment and re-setting the minimum and maximum costs until the minimum cost is not smaller than the maximum cost.

16. The computer useable medium of claim 14, wherein the computer readable program code that causes the computer to divide of the first rectangle causes the computer to place each point of the first rectangle in at least two second rectangles.

17. The computer useable medium of claim 14, wherein the third computer readable program code causes the computer to execute Kuhn's algorithm.

18. The computer useable medium of claim 14, wherein the third computer readable program code comprises, for each second rectangle:

computer readable program code for causing the computer to find objects assigned to points of the second rectangle, and computer readable program code for causing the computer to execute Kuhn's algorithm to re-calculate the assignment of objects in the second rectangle.

19. The computer useable medium of claim 18, further comprising:

computer readable program code for causing the computer to iteratively repeat execution of the computer readable program code for executing Kuhn's algorithm until occurrence of a predetermined event.

20. A process of assigning objects to points of a first rectangle comprising steps of:

a) creating an initial object assignment to points of the first rectangle with an initial assignment procedure, comprising:

b) dividing the first rectangle into a plurality of second rectangles so that each point in the first rectangle is in at least two second rectangles; and c) applying an object assignment procedure, which is different than the initial object assignment procedure, to the initially assigned objects in each second rectangle.

* * * * *